United States Patent
Remboski et al.

(10) Patent No.: US 11,264,653 B2
(45) Date of Patent: Mar. 1, 2022

(54) BATTERY CELL MONITORING SYSTEM

(71) Applicants: Neapco Intellectual Property Holdings, LLC, Farmington Hills, MI (US); Aware Mobility LLC, Ann Arbor, MI (US)

(72) Inventors: Donald Remboski, Ann Arbor, MI (US); Jacqueline Dedo, Wolverine Lake, MI (US)

(73) Assignee: NEAPCO INTELLECTUAL PROPERTY HOLDINGS, LLC, Farmington Hills, MI (US)

( * ) Notice: Subject to any disclaimer, the term of this patent is extended or adjusted under 35 U.S.C. 154(b) by 542 days.

(21) Appl. No.: 16/160,034

(22) Filed: Oct. 15, 2018

(65) Prior Publication Data
US 2019/0115636 A1    Apr. 18, 2019

Related U.S. Application Data

(60) Provisional application No. 62/572,657, filed on Oct. 16, 2017.

(51) Int. Cl.
*G01R 31/36* (2020.01)
*H01M 10/48* (2006.01)
(Continued)

(52) U.S. Cl.
CPC ........ *H01M 10/482* (2013.01); *G01R 31/382* (2019.01); *G01R 31/389* (2019.01);
(Continued)

(58) Field of Classification Search
CPC . G01R 31/389; G01R 31/396; G01R 31/3842
See application file for complete search history.

(56) References Cited

U.S. PATENT DOCUMENTS

| 1,843,320 A | 2/1932 | Goode |
| 3,487,295 A | 12/1969 | Nocera et al. |

(Continued)

FOREIGN PATENT DOCUMENTS

| EP | 1619496 B1 | 6/2007 |
| EP | 2413152 A1 | 2/2012 |

(Continued)

OTHER PUBLICATIONS

International Search Report; PCT/US2018/055980; 6 pages; dated Feb. 6, 2019.

(Continued)

*Primary Examiner* — Son T Le
(74) *Attorney, Agent, or Firm* — Dickinson Wright PLLC

(57) ABSTRACT

A battery cell monitoring system and method of operating the system are provided. The system includes a plurality sense lines and a plurality of cell sense units that each include an active semiconductor device are electrically coupled to the sense lines for transferring a device current characteristic of a bias voltage based on an input device voltage applied thereto. A cell sense reader unit includes a voltage generator for outputting the input voltage to the cell sense units in an alternating fashion across each of the sense lines. The cell sense reader unit includes a current measuring device for sampling the device current output from the active semiconductor device as the input device voltage is alternated. The cell sense reader unit calculates the bias voltage and determines a cell voltage of each of a plurality of battery cells each connected to one of the cell sense units.

20 Claims, 6 Drawing Sheets

(51) Int. Cl.
*H01M 10/04* (2006.01)
*G01R 31/382* (2019.01)
*G01R 31/389* (2019.01)
*G01R 31/396* (2019.01)
*G01R 31/3842* (2019.01)

(52) U.S. Cl.
CPC ....... *G01R 31/3842* (2019.01); *G01R 31/396* (2019.01); *H01M 10/0431* (2013.01)

(56) References Cited

U.S. PATENT DOCUMENTS

| | | | |
|---|---|---|---|
| 3,500,372 | A | 3/1970 | Thiele |
| 3,949,545 | A | 4/1976 | Chihara |
| 4,507,572 | A | 3/1985 | Hashimoto et al. |
| 5,099,211 | A | 3/1992 | Nowak |
| 5,153,496 | A | 10/1992 | LaForge |
| 5,546,003 | A | 8/1996 | Noworolski et al. |
| 7,535,246 | B2 | 5/2009 | Okawa |
| 7,598,709 | B2* | 10/2009 | Guang ............ H02J 7/0086 320/135 |
| 9,612,290 | B2 | 4/2017 | Chau et al. |
| 2003/0156084 | A1* | 8/2003 | Tsuchiya ............ G09G 3/3233 345/84 |
| 2006/0139008 | A1 | 6/2006 | Park |
| 2007/0108992 | A1 | 5/2007 | Yanagisawa |
| 2009/0058370 | A1* | 3/2009 | Odaohhara ....... H02J 7/007192 320/152 |
| 2010/0060295 | A1 | 3/2010 | Ishikawa et al. |
| 2010/0090540 | A1* | 4/2010 | Tanaka .................. H02J 7/0021 307/115 |
| 2011/0074431 | A1 | 3/2011 | Li |
| 2011/0298424 | A1* | 12/2011 | Yamauchi ............... B60L 58/18 320/118 |
| 2013/0026994 | A1* | 1/2013 | Morikawa ............. H02J 7/0021 320/134 |
| 2013/0169297 | A1 | 7/2013 | Pilz |
| 2014/0159735 | A1* | 6/2014 | Buzon ............... H01M 8/04552 324/426 |

FOREIGN PATENT DOCUMENTS

| | | |
|---|---|---|
| EP | 3037830 A1 | 6/2016 |
| JP | H06233473 A | 8/1994 |
| JP | H06233474 A | 8/1994 |
| JP | 2004157077 A | 6/2004 |
| WO | 2005124965 A2 | 12/2005 |
| WO | 2014156263 A1 | 10/2014 |
| WO | 2017155272 A1 | 9/2017 |

OTHER PUBLICATIONS

International Search Report; PCT/US2018/055982; 10 pages; dated Jan. 7, 2019.

* cited by examiner

BATTERY CELL MONITORING SYSTEM

CROSS REFERENCE TO RELATED APPLICATIONS

This utility application claims the benefit of U.S. Provisional Application No. 62/572,657 filed Oct. 16, 2017. The entire disclosure of the above application is incorporated herein by reference.

FIELD

The present disclosure relates generally to a battery cell monitoring system for a battery having a plurality of battery cells. The present disclosure also relates to a method of operating the battery cell monitoring system.

BACKGROUND

This section provides background information related to the present disclosure which is not necessarily prior art.

Batteries are commonly used on a myriad of different applications, from portable electronic devices to electric and hybrid vehicles. Vehicle batteries, for example, include numerous battery cells and may include battery monitoring systems. Typical battery monitoring systems monitor overall battery temperature, voltage and current and will sometimes monitor these parameters on a "module" level. A module is a subset of multiple battery cells in the battery connected in such a way that the parameters can be measured for the module alone.

Nevertheless, monitoring at the battery level or module level does not give the best insight into the performance of each individual cell in the battery. This is particularly true when the number of cells in the module or battery is large. With parameters from a large number of cells combined in a bulk measurement, small changes in individual cells are difficult to discern. Accordingly, there remains a need for an improved battery cell monitoring system.

SUMMARY

This section provides a general summary of the present disclosure and is not a comprehensive disclosure of its full scope or all of its features and advantages.

It is an object of the present disclosure to provide battery cell monitoring system that addresses and overcomes the above-noted shortcomings.

Accordingly, it is an aspect of the present disclosure to provide a battery cell monitoring system for a battery having a plurality of battery cells. The battery cell monitoring system includes a plurality of positive sense lines and a plurality of negative sense lines. In addition, the battery cell monitoring system includes a plurality of cell sense units each including an active semiconductor device for transferring a device current characteristic of a bias voltage based on an input device voltage applied thereto. Each active semiconductor device is electrically coupled to one of the plurality of battery cells and one of the plurality of positive sense lines and one of the plurality of negative sense lines. The battery cell monitoring system also includes a cell sense reader unit electrically coupled to the plurality of positive sense lines and the plurality of negative sense lines and is configured to calculate the bias voltage corresponding with a sampled device current transferred by the active semiconductor device and determine a cell voltage of each of the plurality of battery cells based on the bias voltage calculated.

According to another aspect of the disclosure, a cell sense unit of battery cell monitoring system for a battery cell of a battery is also provided. The cell sense unit includes a positive sense line and a negative sense line for coupling to a cell sense reader unit. The cell sense unit also includes an active semiconductor device for transferring a device current characteristic of a first device voltage based on a second device voltage applied thereto and electrically coupled to the positive sense line and the negative sense line and to the battery cell of the battery. In addition, the cell sense unit includes a first blocking capacitor that has a first blocking capacitance and is electrically connected between the positive sense line and the active semiconductor device for blocking direct current from the battery. The cell sense unit additionally includes a second blocking capacitor that has a second blocking capacitance and is electrically connected between the negative sense line and the negative terminal of the battery for blocking direct current from the battery.

According to yet another aspect of the disclosure, a method of operating a battery cell monitoring system is additionally provided. The method begins by outputting an input voltage to a plurality of cell sense units with a voltage generator of a cell sense reader unit in an alternating fashion across each of a plurality of positive sense lines and a plurality of negative sense lines. The method continues by transferring a device current characteristic of a bias voltage based on an input device voltage applied using an active semiconductor device of each of the plurality of cell sense units electrically coupled to one of the plurality of positive sense lines and one of the plurality of negative sense lines. The next step of the method is sampling the device current transferred by the active semiconductor device of each of the plurality of cell sense units using a current measuring device of the cell sense reader unit as the input device voltage is alternated by the voltage generator. The method proceeds with the step of calculating the bias voltage corresponding with the sampled device current for each active semiconductor device. The method concludes by determining a cell voltage of each of a plurality of battery cells electrically connected to one of the plurality of cell sense units based on the bias voltage calculated.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to a battery cell monitoring system of the type well-suited for use in many applications. The battery cell monitoring system and associated methods of operation of this disclosure will be described in conjunction with one or more example embodiments. However, the specific example embodiments disclosed are merely provided to describe the inventive concepts, features, advantages and objectives will sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Figure 1:
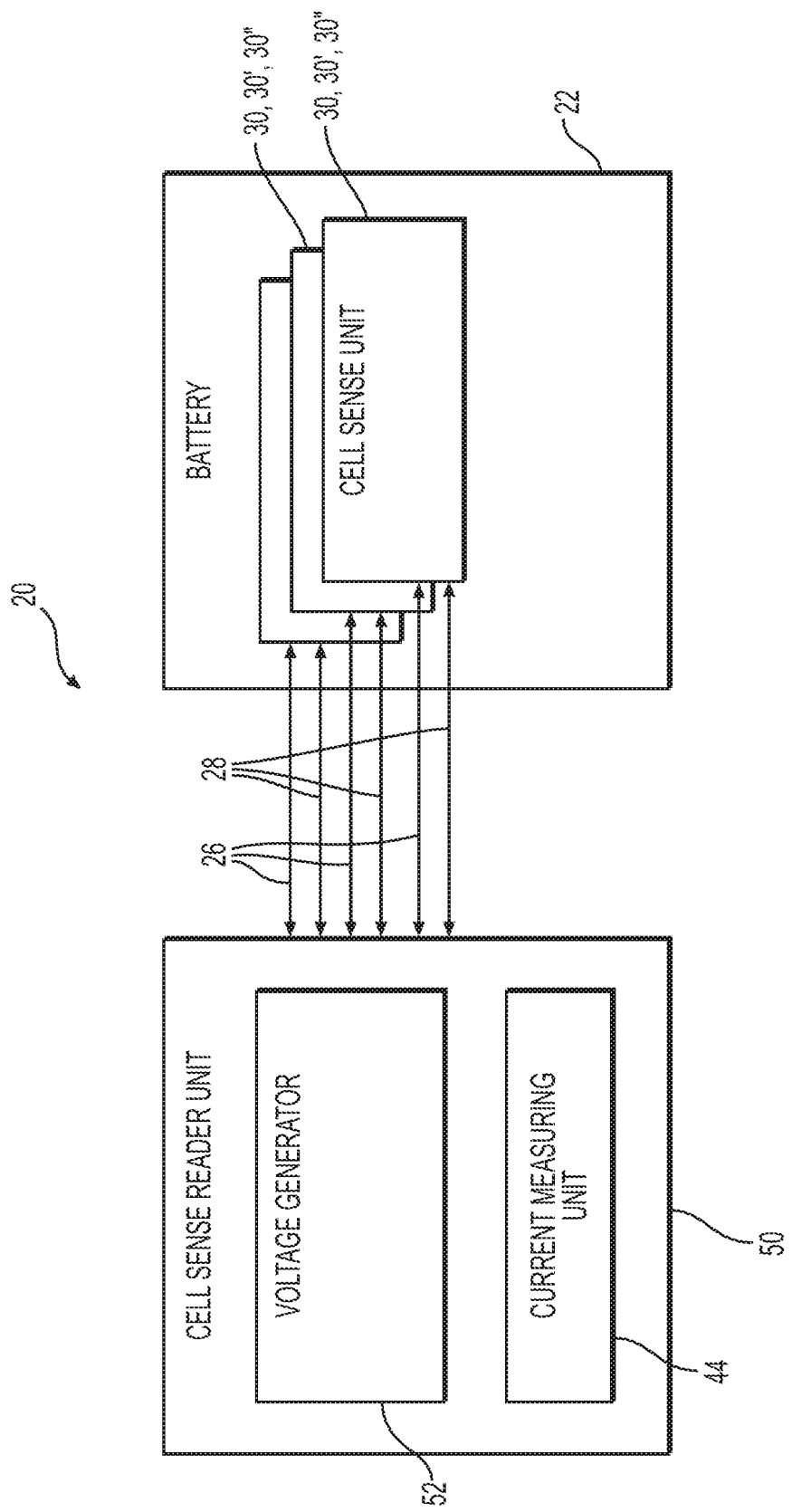
FIG. 1 illustrates a battery monitoring system according to aspects of the disclosure.
Figure 2:
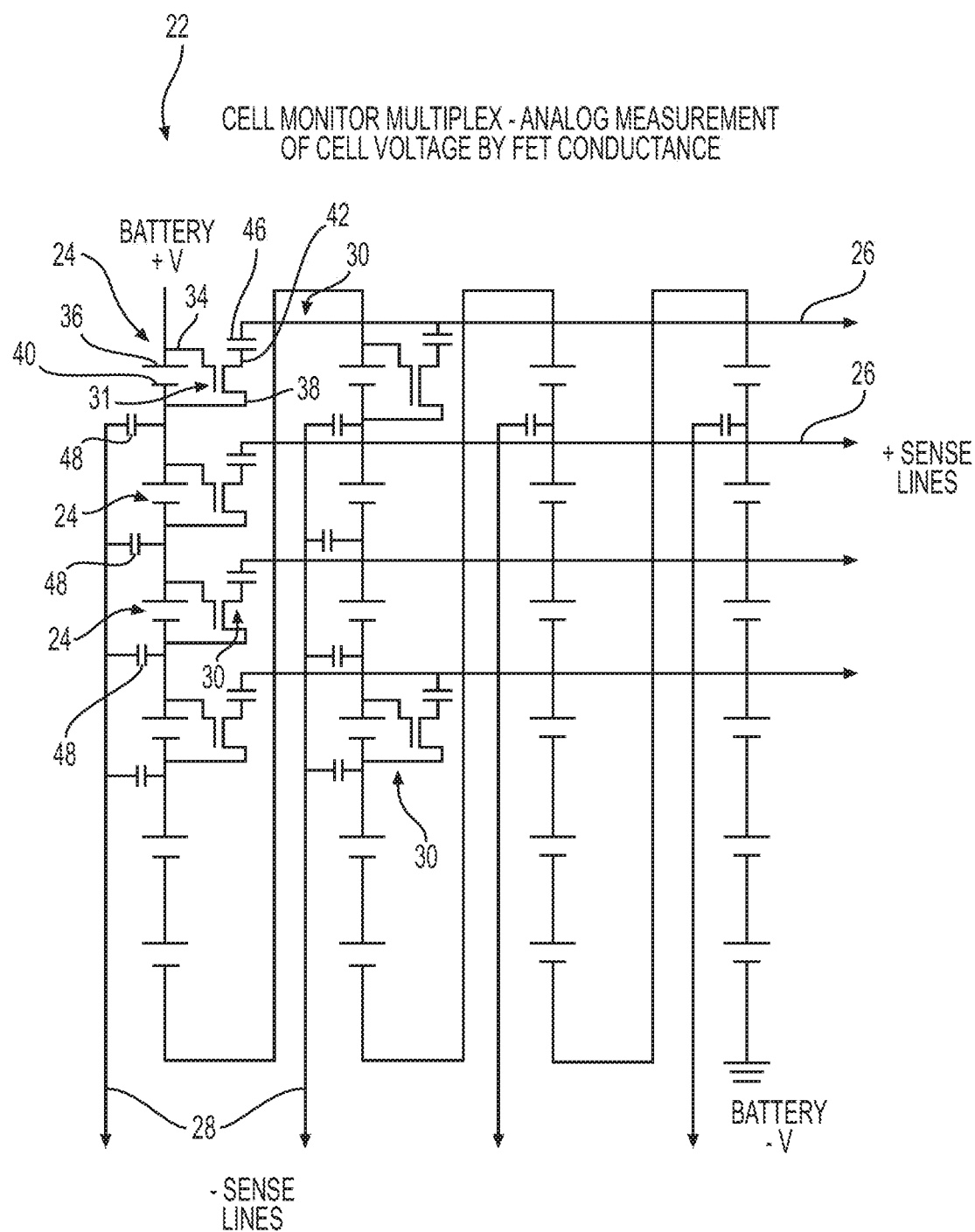
FIG. 2 illustrates a cell sense unit of the battery cell monitoring system of FIG. 1 according to aspects of the disclosure.

Referring to the Figures, wherein like numerals indicate corresponding parts throughout the several views, a battery cell monitoring system 20 for a battery 22 having a plurality of battery cells 24 is shown in FIGS. 1 and 2. Specifically, the battery 22 is a series cell stack. The battery cell monitoring system 20 includes a plurality of positive sense lines 26 and a plurality of negative sense lines 28.

A plurality of cell sense units 30 each include an active semiconductor device 31, 32, 33 (FIG. 2) for transferring a device current characteristic of a bias voltage based on an input device voltage applied thereto. The active semiconductor device 31, 32, 33 of each of the plurality of cell sense units 30 is electrically coupled to one of the plurality of positive sense lines 26 and one of the plurality of negative sense lines 28. According to an aspect, and as shown in FIG. 2, the active semiconductor device 31, 32, 33 is a field effect transistor (FET) 31 that has a gate 34 electrically connected to a positive terminal 36 of the battery cell 24 and a source 38 electrically connected to a negative terminal 40 of the battery cell 24 and a drain 42 electrically coupled to the positive sense line 26.

While the active semiconductor device 31, 32, 33 that is used in the cell sense unit 30 illustrated in FIGS. 1 and 2 is a junction gate field effect transistor 31, it should be understood that a number of other active semiconductor devices 31, 32, 33 may alternatively be used in a similar manner. These include bipolar junction transistors (BJTs) 32, metal oxide semiconductor field effect transistors (MOSFETs), and silicon controlled rectifiers (SCRs) 33. These active semiconductor devices 31, 32, 33 may be tailored to the cell monitoring task with cutoff and threshold characteristics to match the voltage range of the battery cell 24 being monitored.

Each of the plurality of call sense units 30 also includes a first blocking capacitor 46 (i.e., coupling capacitor) that has a first blocking capacitance that is electrically connected between the positive sense line 26 and the drain 42 of the field effect transistor 31 for blocking direct current from the battery 22. Similarly, a second blocking capacitor 48 (i.e., coupling capacitor) that has a second blocking capacitance is electrically connected between the negative sense line 28 and the negative terminal 40 of the battery 22 for blocking direct current from the battery 22.

A cell sense reader unit 50 is electrically coupled to the plurality of positive sense lines 26 and the plurality of negative sense lines 28 and includes a voltage generator 52 for outputting the input device voltage (e.g., $V_{ds}$ of the field effect transistor 31) to the plurality of cell sense units 30 in an alternating fashion (e.g., at a frequency of 100 MHz) across each of the plurality of positive sense lines 26 and the plurality of negative sense lines 28. So, a channel characteristic of the field effect transistor 31 changes based on the bias voltage or bias voltage (e.g., $V_{gs}$) applied to the gate 34 of the field effect transistor 31 by the battery cell 24 being monitored. The channel characteristic of the field effect transistor 31 can be measured by applying the alternating current voltage (e.g., input device voltage $V_{ds}$ of the field effect transistor 31) to the positive sense lines 26 and negative sense lines 28 associated with the battery cell 24 (i.e., for that particular cell sense unit 30).

Figure 3:
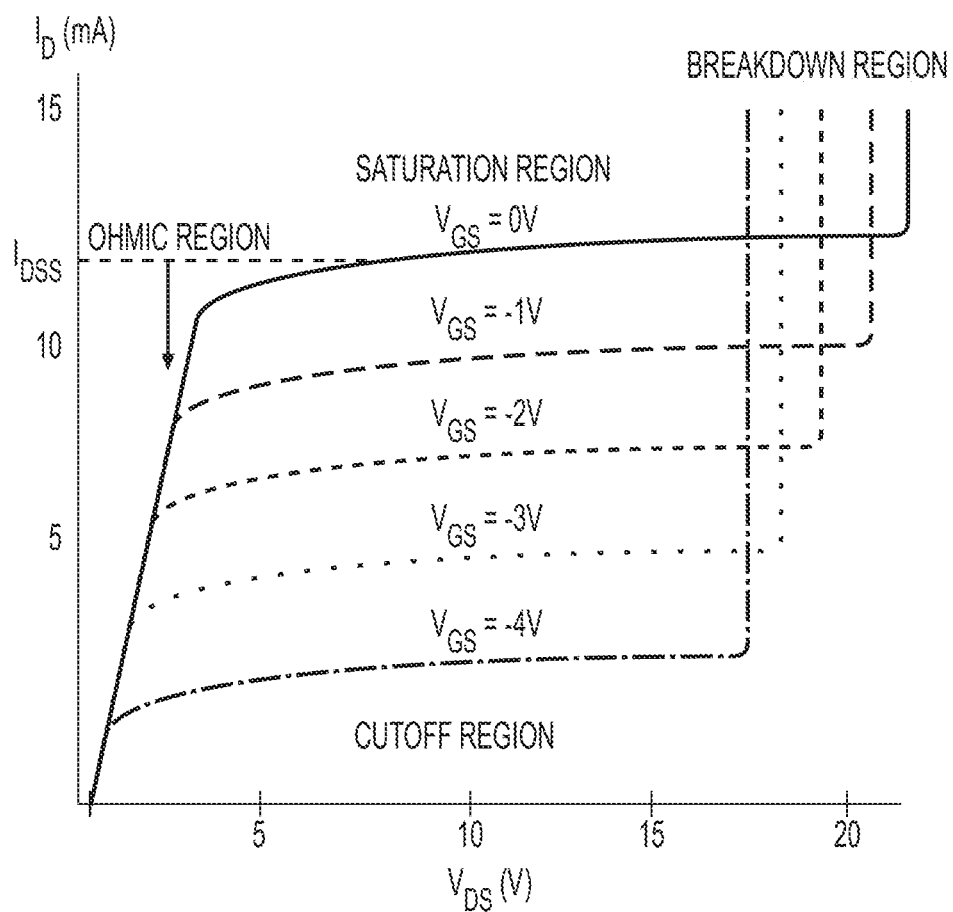
FIG. 3 illustrates characteristic current versus voltage curves for a field effect transistor of the cell sense unit according to aspects of the disclosure.

The cell sense reader unit 50 also includes a current measuring device 44 for sampling the device current (e.g., $I_{ds}$ of the field effect transistor 31) output from the active semiconductor device 31, 32, 33 as the input device voltage (e.g., $V_{ds}$ of the field effect transistor 31) is alternated by the voltage generator 52. In this measurement, for example, the current versus voltage relationship or characteristic curve (device current versus input device voltage) of the field effect transistor 31 is measured. Example characteristic curves for a junction gate field effect transistor 31 (JFET) are shown in FIG. 3. The cell sense reader unit 50 is configured to calculate the bias voltage (e.g., $V_{gs}$ of the field effect transistor 31) corresponding with the sampled device current (e.g., $I_{ds}$ of the field effect transistor 31). The cell sense reader unit 50 is also configured to determine a cell voltage of each of a plurality of battery cells 24 each electrically connected to one of the plurality of cell sense units 30 based on the bias voltage (e.g., $V_{gs}$ of the field effect transistor 31) calculated. Specifically, from knowledge of the characteristics of the field effect transistor 32, the base bias voltage (e.g., $V_{gs}$ of the field effect transistor 31) that led to a particular current vs. voltage characteristic is calculated (based on the sampled device current). In particular, the slope of the current vs. voltage characteristic curve in a linear region of the field effect transistor 32 can be measured and saturation current at higher source voltages can also be measured. In the disclosed arrangement of the field effect transistor 31, the bias voltage (e.g., $V_{gs}$ of the field effect transistor 31) is the cell voltage. Thus, the disclosed battery cell monitoring system 20 advantageously allows a relatively rapid sampling rate of cell parameters (e.g., cell voltage). When the determined cell voltage is combined with knowledge of cell current and temperature, more capable cell models may be used for analysis of the battery 22. This includes models using non-traditional parameters such as mass-transfer resistance.

Figure 4:
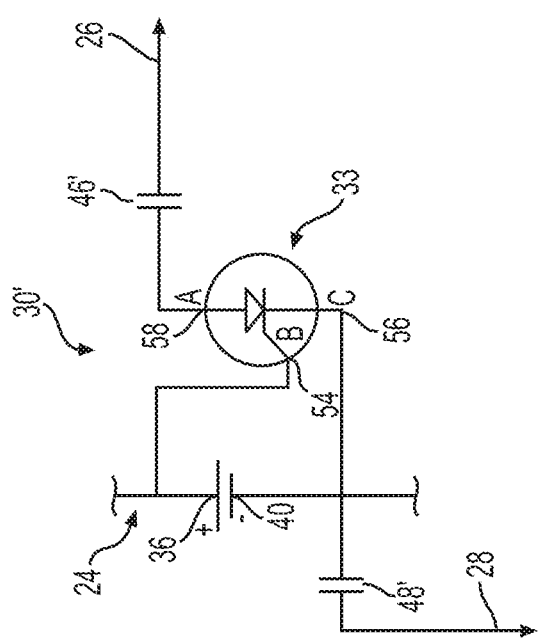
FIG. 4 illustrates a cell sense unit of the battery cell monitoring system of FIG. 1 according to aspects of the disclosure.

According to an aspect and as shown in FIG. 4, each of the plurality of cell sense units 30' includes a silicon controlled rectifier 33 instead of the field effect transistor 31 shown in the cell sense unit 30 of FIG. 2. The silicon controlled rectifier 33 has a rectifier gate 54 electrically connected to the positive terminal 36 of the battery cell 24 of the battery 22 and a rectifier cathode 56 electrically connected to the negative terminal 40 of the battery cell 24 and a rectifier anode 58 electrically coupled to the positive sense line 26. So, as with the junction gate field effect transistor 31, the silicon controlled rectifier 33 of each of the plurality of cell sense units 30' is electrically coupled to one of the plurality of positive sense lines 26 and one of the plurality of negative sense lines 28 through the first blocking capacitor 46' and second blocking capacitor 48'. Specifically, the first blocking capacitor 46' is electrically connected between the positive sense line 26 and the rectifier anode 58 of the silicon controlled rectifier 33 for blocking direct current from the battery cell 24. Similarly, the second blocking capacitor 48' is electrically connected between the negative sense line 28 and the negative terminal 40 of the battery cell 24 for blocking direct current from the battery cell 24. With this configuration, a forward break-over voltage of the silicon controlled rectifier 33 is determined by the cell voltage of the battery cell 24. When the break-over voltage is exceeded, current will flow from the positive sense line 26 to the negative sense line 28. So, the onset of this current flow as a function of the voltage across the rectifier anode 58 and rectifier cathode 56 is an indicator of the cell voltage of the battery cell 24.

Figure 5:
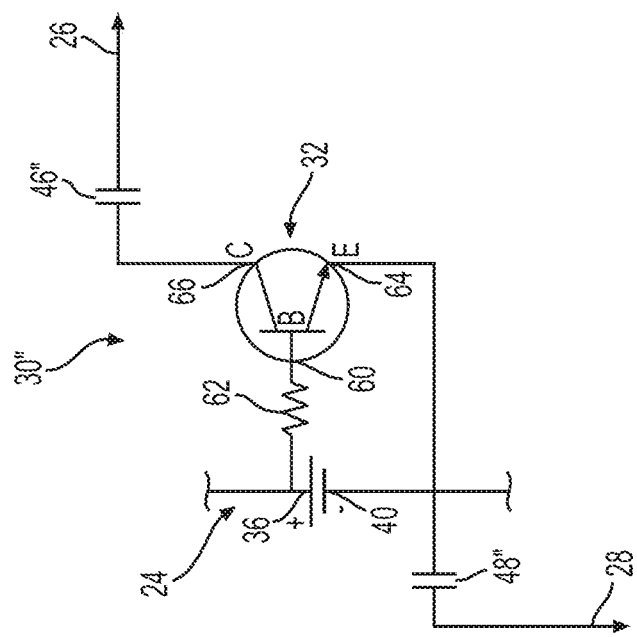
FIG. 5 illustrates a cell sense unit of the battery cell monitoring system of FIG. 1 according to aspects of the disclosure.

In cases where a small continuous current drain on the battery cell 24 is acceptable, a BJT 32 may be used. Thus, according to another aspect and as shown in FIG. 5, each of the plurality of cell sense units 30" includes a bipolar junction transistor 32 that has a base 60 electrically connected to the positive terminal 36 of the battery cell 24 through a biasing resistor 62 and an emitter 64 electrically connected to the negative terminal 40 of the battery cell 24 and a collector 66 electrically coupled to the positive sense line 26. The bipolar junction transistor 32 of each of the plurality of cell sense units 30" is electrically coupled to one of the plurality of positive sense lines 26 and one of the plurality of negative sense lines 28 through the first blocking capacitor 46" and second blocking capacitor 48". In more detail, the first blocking capacitor 46" is electrically connected between the positive sense line 26 and the collector 66 of the bipolar junction transistor 32 for blocking direct current from the battery cell 24. Similarly, the second blocking capacitor 48' is electrically connected between the negative sense line 28 and the negative terminal 40 of the battery cell 24 for blocking direct current from the battery cell 24. In this configuration, the base 60 of the bipolar junction transistor 32 is biased by a small current supplied by the cell voltage of the battery cell 24 through the biasing resistor 62. The bias current (from the base 60 to the emitter 64) will increase as cell voltage of the battery cell 24 increases. A saturation collector current (from the collector 66 to the emitter 64) can then be measured between the positive sense line 26 and the negative sense line 28.

For active semiconductor devices 31, 32, 33 that include a PN junction or boundary between a p-type type of semiconductor material and an n-type semiconductor material (e.g., the junction gate field effect transistor 31) that is periodically forward-biased, the temperature of the active semiconductor device 31, 32, 33 can be estimated from the voltage drop across the active semiconductor device 31, 32, 33 while forward biased. The voltage drop across the active semiconductor device 31, 32, 33 typically drops with increasing temperature. This allows the measurement of the temperature of the battery cell 24 and estimation of the electrical performance of the active semiconductor device 31, 32, 33 with respect to voltage for calibration purposes. Also, for devices 31, 32, 33 that include a PN junction that is periodically reverse biased where it is possible to measure the reverse leakage current (on the order of a microamp) the temperature of the active semiconductor device 31, 32, 33 can be calculated from the magnitude of the reverse leakage current. If the active semiconductor device 31, 32, 33 containing the PN junction is thermally connected to the battery cell 24, this forms a cell temperature measurement.

The battery cell monitoring system 20 can also include other approaches such as, but not limited to, gated time to charge or discharge of a sense capacitor, time domain reflections of sense circuits along a transmission line, and clocked bucket brigade charge or voltage transfer through shared lines.

Figure 6:
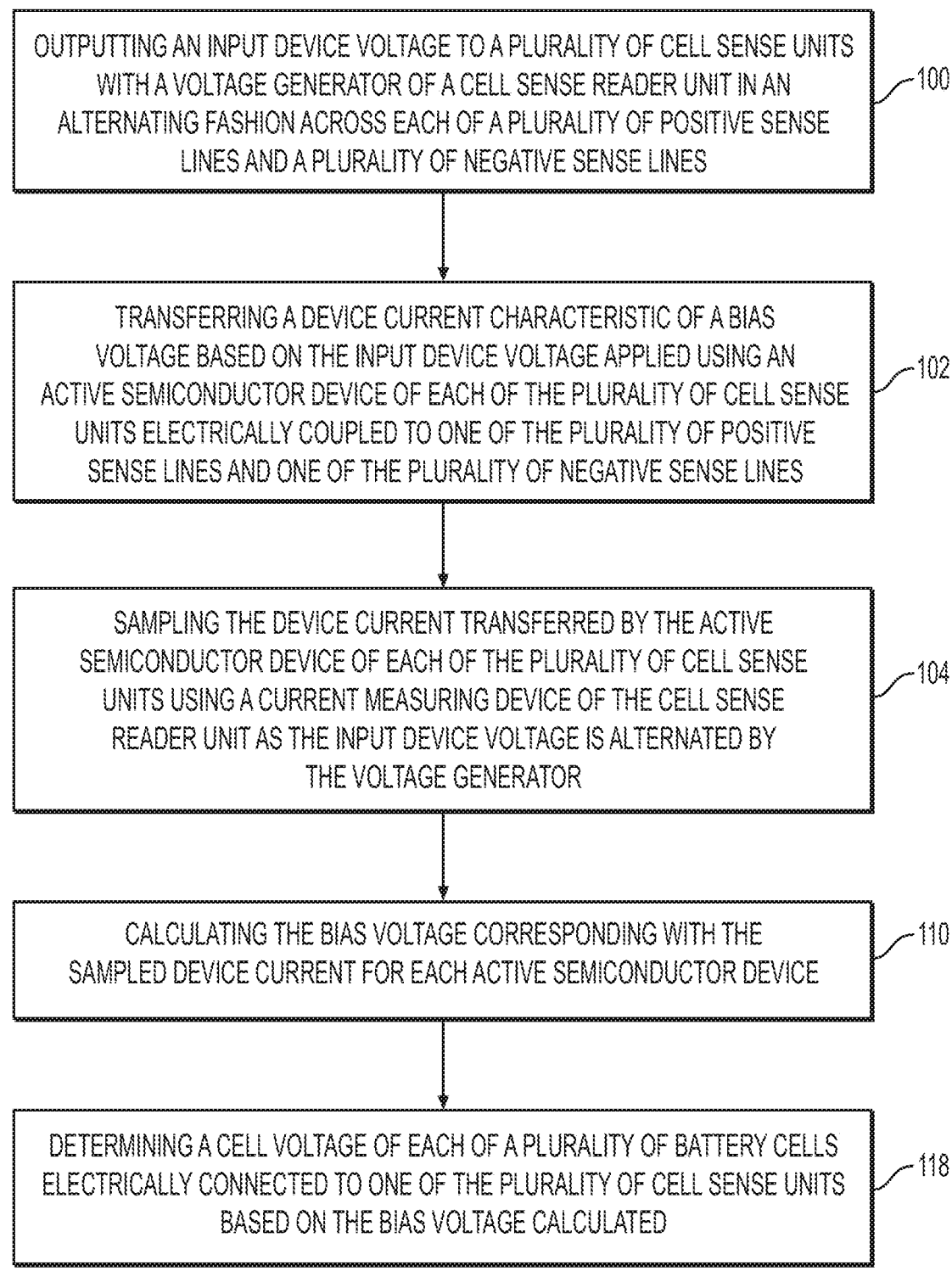
FIGS. 6 and 7 illustrate steps of a method of operating the battery cell monitoring system of FIG. 1 according to aspects of the disclosure.
Figure 7:
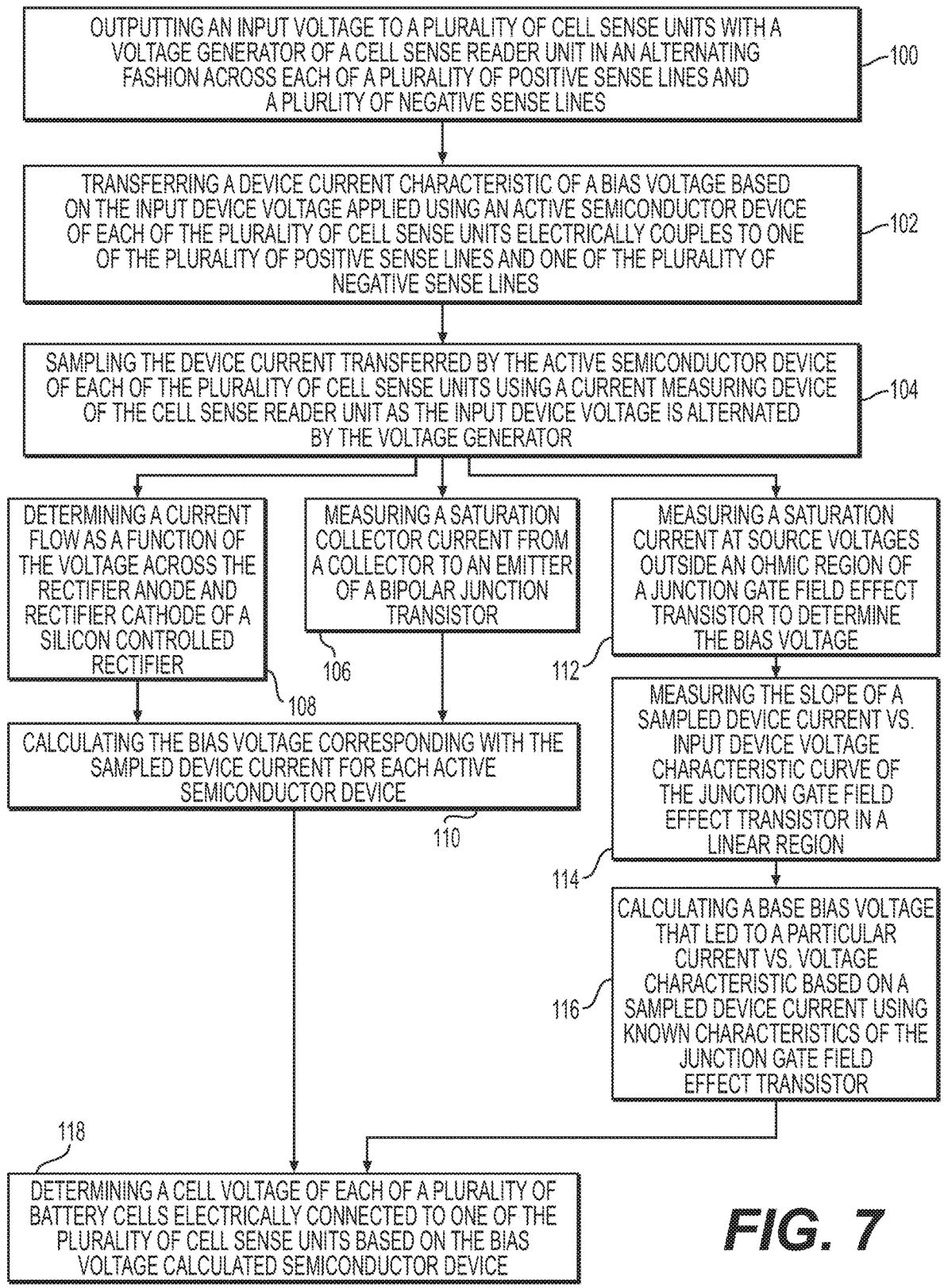

As best shown in FIGS. 6 and 7, a method of operating a battery cell monitoring system 20 is additionally provided. The method begins by 100 outputting an input device voltage to a plurality of cell sense units 30, 30', 30" with a voltage generator 52 of a cell sense reader unit 50 in an alternating fashion across each of a plurality of positive sense lines 26 and a plurality of negative sense lines 28.

The method continues by 102 transferring a device current characteristic of a bias voltage (e.g., $V_{gs}$ of the junction gate field effect transistor 31) based on an input device voltage (e.g., $V_{ds}$ of the junction gate field effect transistor 31) applied using an active semiconductor device 31, 32, 33 (e.g., junction gate field effect transistor 31) of each of the plurality of cell sense units 30, 30', 30" electrically coupled to one of the plurality of positive sense lines 26 and one of the plurality of negative sense lines 28. The next step of the method is 104 sampling the device current (e.g., $I_{ds}$ of the junction gate field effect transistor 31) transferred by the active semiconductor device 31, 32, 33 of each of the plurality of cell sense units 30, 30', 30" using a current measuring device 44 of the cell sense reader unit 50 as the input device voltage (e.g., $V_{ds}$ of the junction gate field effect transistor 31) is alternated by the voltage generator 52. For the bipolar junction transistor 32, the method can include the step of 106 measuring a saturation collector current from a collector 66 to an emitter 64 of a bipolar junction transistor 32, for example. For the silicon controlled rectifier 33, the method can include the step of 108 determining a current flow as a function of the voltage across the rectifier anode 58 and rectifier cathode 56 of a silicon controlled rectifier 33.

The method proceeds with the step of 110 calculating the bias voltage corresponding with the sampled device current (e.g., $I_{ds}$ of the junction gate field effect transistor 31) for each active semiconductor device 31, 32, 33. For the junction gate field effect transistor 31, the step of 110 calculating the bias voltage corresponding with the sampled device current for each active semiconductor device 31, 32, 33 can include the step of 112 measuring a saturation current at source voltages outside an ohmic region of the junction gate field effect transistor 31 to determine the bias voltage. The method can also include the step of 114 measuring the slope of a sampled device current vs. input device voltage characteristic curve of the junction gate field effect transistor 31 in a linear region and 116 calculating a base bias voltage ($V_{gs}$) that led to a particular current vs. voltage characteristic based on a sampled device current using known characteristics of the junction gate field effect transistor 31.

The method concludes by 118 determining a cell voltage of each of a plurality of battery cells 24 electrically connected to one of the plurality of cell sense units 30, 30', 30" based on the bias voltage (e.g., $V_{gs}$ of the junction gate field effect transistor 31) calculated.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Those skilled in the art will recognize that concepts disclosed in association with the example battery monitoring system can likewise be implemented into many other systems to control one or more operations and/or functions.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

What is claimed is:

1. A battery cell monitoring system for a battery having a plurality of battery cells comprising:
   a plurality of positive sense lines and a plurality of negative sense lines;
   a plurality of cell sense units each including an active semiconductor device having a known relationship between a device current and an input device voltage for transferring the device current characteristic of a bias voltage based on the known relationship between the device current and the input device voltage and the input device voltage applied thereto and electrically coupled to one of the plurality of battery cells and one of said plurality of positive sense lines and one of said plurality of negative sense lines and configured to conduct the device current according to a cell voltage of each of the plurality of battery cells, the bias voltage being provided by each of the plurality of battery cells;
   a cell sense reader unit electrically coupled to said plurality of positive sense lines and said plurality of negative sense lines and configured to:
   calculate the bias voltage corresponding with a sampled device current transferred by said active semiconductor device, and
   determine the cell voltage of each of the plurality of battery cells based on the bias voltage calculated.

2. The battery cell monitoring system of claim 1, wherein said cell sense reader unit includes a voltage generator for outputting the input voltage to said plurality of cell sense units in an alternating fashion across each of said plurality of positive sense lines and said plurality of negative sense lines.

3. The battery cell monitoring system of claim 1, wherein said cell sense reader unit includes a current measuring device for sampling the device current output from said active semiconductor device as the input device voltage is alternated by said voltage generator.

4. The battery cell monitoring system of claim 1, wherein said active semiconductor device is a field effect transistor having a gate electrically connected to a positive terminal of the battery cell and a source electrically connected to a negative terminal of the battery and a drain electrically coupled to said positive sense line.

5. The battery cell monitoring system of claim 4, wherein said cell sense reader unit is further configured to calculate a base bias voltage that led to a particular current versus voltage characteristic based on the sampled device current using the known relationship between the device current and the input device voltage of the junction gate field effect transistor.

6. The battery cell monitoring system of claim 4, further including a first blocking capacitor having a first blocking capacitance electrically connected between said positive sense line and said drain of said field effect transistor for blocking direct current from the battery and a second blocking capacitor having a second blocking capacitance electrically connected between said negative sense line and the negative terminal of the battery for blocking direct current from the battery.

7. The battery cell monitoring system of claim 1, wherein said active semiconductor device is a silicon controlled rectifier having a rectifier gate electrically connected to the positive terminal of the one of the plurality of battery cells of the battery and a rectifier cathode electrically connected to the negative terminal of one of the plurality of the battery cells and a rectifier anode electrically coupled to said one of said plurality of positive sense lines.

8. The battery cell monitoring system of claim 6, further including a first blocking capacitor electrically connected between said one of said plurality of positive sense lines and said rectifier anode of said silicon controlled rectifier for blocking direct current from the battery cell and a second blocking capacitor electrically connected between said one of said plurality of negative sense lines and the negative terminal of the one of the plurality of battery cells for blocking direct current from one of the plurality of battery cells.

9. The battery cell monitoring system of claim 1, wherein said active semiconductor device is a bipolar junction transistor having a base electrically connected to the positive terminal of the one of the plurality of battery cells through a biasing resistor and an emitter electrically connected to the negative terminal of the one of the plurality of battery cells and a collector electrically coupled to said one of said plurality of positive sense lines.

10. The battery cell monitoring system of claim 6, further including a first blocking capacitor electrically connected between said one of said one of said plurality of positive sense lines and said collector of said bipolar junction transistor for blocking direct current from the one of the plurality of battery cells and a second blocking capacitor electrically connected between said one of said plurality of negative sense lines and the negative terminal of the one of the plurality of battery cells for blocking direct current from the one of the plurality of battery cells.

11. A cell sense unit of a battery cell monitoring system for a battery cell of a battery, comprising:
   a positive sense line and a negative sense line for coupling to a cell sense reader unit;
   an active semiconductor device having a known relationship between a device current and a second device voltage for transferring the device current characteristic of a first device voltage based on the known relationship between the device current and the second device voltage and the second device voltage applied thereto and electrically coupled to said positive sense line and said negative sense line and to the battery cell of the battery and configured to conduct the device current according to a cell voltage of the battery cell;
   a first blocking capacitor having a first blocking capacitance electrically connected between said positive sense line and said active semiconductor device for blocking direct current from the battery; and
   a second blocking capacitor having a second blocking capacitance electrically connected between said negative sense line and the negative terminal of the battery for blocking direct current from the battery.

12. The cell sense unit of claim 11, wherein said active semiconductor device is a field effect transistor having a gate electrically connected to a positive terminal of the battery cell and a source electrically connected to a negative terminal of the battery and a drain electrically coupled to said positive sense line.

13. The cell sense unit of claim 11, wherein said active semiconductor device is a silicon controlled rectifier having a rectifier gate electrically connected to a positive terminal of the battery cell and a rectifier cathode electrically connected to a negative terminal of the battery cell and a rectifier anode electrically coupled to said one of said plurality of positive sense lines.

14. The cell sense unit of claim 11, wherein said active semiconductor device is a bipolar junction transistor having a base electrically connected to a positive terminal of the battery cell through a biasing resistor and an emitter electrically connected to a negative terminal of the battery cell and a collector electrically coupled to said one of said plurality of positive sense lines.

15. A method of operating a battery cell monitoring system comprising the steps of:
   outputting an input voltage to a plurality of cell sense units with a voltage generator of a cell sense reader unit in an alternating fashion across each of a plurality of positive sense lines and a plurality of negative sense lines;
   transferring a device current characteristic of a bias voltage based on an input device voltage applied using an active semiconductor device of each of the plurality of cell sense units having a known relationship between the device current and the input device voltage and configured to conduct the device current according to a cell voltage of each of a plurality of battery cells and electrically coupled to one of the plurality of positive sense lines and one of the plurality of negative sense lines, the bias voltage being provided by each of the plurality of battery cells;
   sampling the device current transferred by the active semiconductor device of each of the plurality of cell sense units using a current measuring device of the cell sense reader unit as the input device voltage is alternated by the voltage generator;
   calculating the bias voltage corresponding with the sampled device current for each active semiconductor device; and
   determining the cell voltage of each of the plurality of battery cells electrically connected to one of said plurality of cell sense units based on the bias voltage calculated.

16. The method of claim 15, wherein the active semiconductor device is a junction gate field effect transistor and the step of calculating the bias voltage corresponding with the sampled device current for each active semiconductor device includes the step of calculating a base bias voltage that led to a particular current versus voltage characteristic based on the sampled device current using the known relationship between the device current and the input device voltage of the junction gate field effect transistor.

17. The method of claim 16, further including the step of measuring the slope of a sampled device current versus input device voltage characteristic curve of the junction gate field effect transistor in a linear region.

18. The method of claim 17, further including the step of measuring a saturation current at source voltages outside an ohmic region of the junction gate field effect transistor to determine the bias voltage.

19. The method of claim 15, wherein the active semiconductor device is a bipolar junction transistor and wherein the step of sampling the device current transferred by the active semiconductor device of each of the plurality of cell sense units using the current measuring device of the cell sense reader unit as the input device voltage is alternated by the voltage generator can include the step of measuring a saturation collector current from a collector to an emitter of a bipolar junction transistor.

20. The method of claim 15, wherein the active semiconductor device is a silicon controlled rectifier and wherein the step of sampling the device current transferred by the active semiconductor device of each of the plurality of cell sense units using the current measuring device of the cell sense reader unit as the input device voltage is alternated by the voltage generator can include the step of determining a current flow as a function of the voltage across the rectifier anode and rectifier cathode of a silicon controlled rectifier.

* * * * *